United States Patent
Moriarty et al.

(10) Patent No.: US 6,947,458 B2
(45) Date of Patent: Sep. 20, 2005

(54) POWER CONTROL CIRCUIT FOR LASER DIODE HAVING WAVELENGTH COMPENSATION

(75) Inventors: Daniel T. Moriarty, Hudson, MA (US); Jerry D. Hutchinson, Littleton, MA (US)

(73) Assignee: Alcatel Communications, Inc., Plano, TX (US)

( * ) Notice: Subject to any disclaimer, the term of this patent is extended or adjusted under 35 U.S.C. 154(b) by 375 days.

(21) Appl. No.: 09/877,921

(22) Filed: Jun. 7, 2001

(65) Prior Publication Data

US 2002/0186732 A1 Dec. 12, 2002

(51) Int. Cl.[7] ............................................. H01S 3/00
(52) U.S. Cl. ............................. 372/38.02; 372/38.01
(58) Field of Search ....................... 372/29.011, 29.012, 372/29.014, 29.015, 25, 34, 38.07, 31, 38, 32, 38.1, 29.01, 29.021, 20–33

(56) References Cited

U.S. PATENT DOCUMENTS

| | | | | |
|---|---|---|---|---|
| 4,081,670 A | * | 3/1978 | Albanese | 372/38.07 |
| 4,345,330 A | * | 8/1982 | Howie et al. | 372/38.07 |
| 5,097,473 A | * | 3/1992 | Taguchi | 372/29.011 |
| 5,136,600 A | | 8/1992 | Fidric et al. | |
| 5,285,464 A | * | 2/1994 | Ogino | 372/38.07 |
| 5,299,212 A | | 3/1994 | Koch et al. | |
| 5,309,458 A | * | 5/1994 | Carl | 372/34 |
| 5,530,712 A | * | 6/1996 | Solina et al. | 372/31 |
| 5,563,898 A | * | 10/1996 | Ikeuchi et al. | 372/38.07 |
| 5,579,328 A | | 11/1996 | Habel et al. | 372/31 |
| 5,666,045 A | * | 9/1997 | Grodevant | 323/282 |
| 5,761,230 A | * | 6/1998 | Oono et al. | 372/38.01 |
| 5,793,786 A | | 8/1998 | Furumiya | 372/38 |
| 5,881,081 A | * | 3/1999 | Hwang | 372/38.04 |
| 5,966,395 A | * | 10/1999 | Ikeda | 372/38.01 |
| 6,091,747 A | * | 7/2000 | Morita et al. | 372/38.02 |
| 6,192,060 B1 | * | 2/2001 | Kobayashi | 372/38.01 |
| 6,226,114 B1 | * | 5/2001 | Ashkeboussi et al. | 398/192 |
| 6,233,261 B1 | | 5/2001 | Mesh et al. | 372/32 |
| 6,233,262 B1 | * | 5/2001 | Mesh et al. | 372/32 |
| 6,282,218 B1 | * | 8/2001 | Anderson | 372/38.02 |
| 6,320,890 B1 | * | 11/2001 | Taguchi | 372/38.02 |
| 6,369,926 B1 | | 4/2002 | Lyu et al. | |

OTHER PUBLICATIONS

VCB Series Optical Attenuators, *The JDS Uniphase Site*, Feb. 13, 2001, one page.
Variable Optical Attenuator, *Nortel Networks*, Preliminary Data Sheet, Feb. 1, 1999, 2 pages.
10 Gb/s Data Modulator w/Integrated VOA, *The JDS Uniphase Site*, Feb. 13, 2001, one page.
10 Gbits/s Lithium Niobate Electro–Optic Modulator, *Lucent Technologies Data Sheet*, Nov. 2000, 4 pages.
ADN2841 Dual Loop 155Mbps to 2.7Gbps Laser Diode Drive, *Analog Devices*, Aug. 2001, 10 pages.

* cited by examiner

*Primary Examiner*—Hoanganh Le
*Assistant Examiner*—Tuan N. Nguyen
(74) *Attorney, Agent, or Firm*—Hamilton, Brook, Smith & Reynolds, P.C.; Jessica W. Smith; V. Lawrence Sewell

(57) ABSTRACT

A control circuit for a laser diode includes a power controller and a wavelength controller. The power controller adjusts a bias current to the laser diode to change the power output of the laser diode. The power change can have a corresponding wavelength shift effect on the nominal operating wavelength of the laser diode. The wavelength controller compensates for the wavelength shift such that the laser diode maintains operation at the nominal wavelength. The circuit provides for electrical control of the laser output power without the need for a costly and bulky optical attenuator. The circuit also provides wavelength control to compensate for the relationship between laser diode operating temperature and wavelength.

9 Claims, 5 Drawing Sheets

POWER CONTROL CIRCUIT FOR LASER DIODE HAVING WAVELENGTH COMPENSATION

BACKGROUND

Wavelength division multiplexed systems, in which multiple channels are carried at different wavelengths on the same optical fiber, require adjustable output power to address problems such as optical crosstalk between channels and power balancing of optical signals for optical amplifiers. It is common today to control the output power of a semiconductor laser diode to maintain a constant operational output level, for example, 0 dBm. The constant output power laser diode is used in combination with an optical attenuator to provide the adjustable output power that is needed. The type of optical attenuator can be either fixed or variable attenuation. The fixed attenuation type is neither field adjustable nor remotely controllable. The variable attenuation type is large and expensive and can require additional power sensing circuitry.

SUMMARY

There is a need for an approach to controlling the output power of laser diodes that is less costly and less bulky than those that require external optical attenuators. There is also a need for a power control mechanism that takes into account the relationship between temperature and wavelength in the operation of laser diodes.

An apparatus and method of the present approach provides for electrical control of the laser output power without the need for a costly and bulky optical attenuator. The present approach further provides wavelength control to compensate for the relationship between laser diode operating temperature and wavelength.

Accordingly, a control circuit for a laser diode includes a power controller and a wavelength controller. The power controller adjusts a bias current to the laser diode to change the power output of the laser diode. The power change can have a corresponding wavelength shift effect on the nominal operating wavelength of the laser diode. The wavelength controller compensates for the wavelength shift such that the laser diode maintains operation at the nominal wavelength.

In an embodiment, the power controller includes a bias current source that provides an adjustable bias current to the laser diode. A power monitor loop includes a backface diode for monitoring the laser diode power output to provide a power monitor signal. A power control signal added to the power monitor signal provides a power adjust signal. The bias current source adjusts the bias current responsive to a difference between a power reference voltage input of the bias current source and the power adjust signal.

In an embodiment, the wavelength controller includes a temperature control circuit that provides a control current to a thermoelectric element for controlling the temperature operation point of the laser diode. A temperature monitor loop includes a temperature sensor for monitoring the temperature operation point to provide a temperature monitor signal. A wavelength compensation signal added to the temperature monitor signal provides a wavelength control signal. The temperature control circuit adjusts the control current to the thermoelectric element responsive to a difference between a temperature reference signal and the wavelength control signal.

Preferably, the wavelength compensation signal is proportional to the power control signal.

In an alternate embodiment, the wavelength controller includes an etalon element for wavelength compensation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
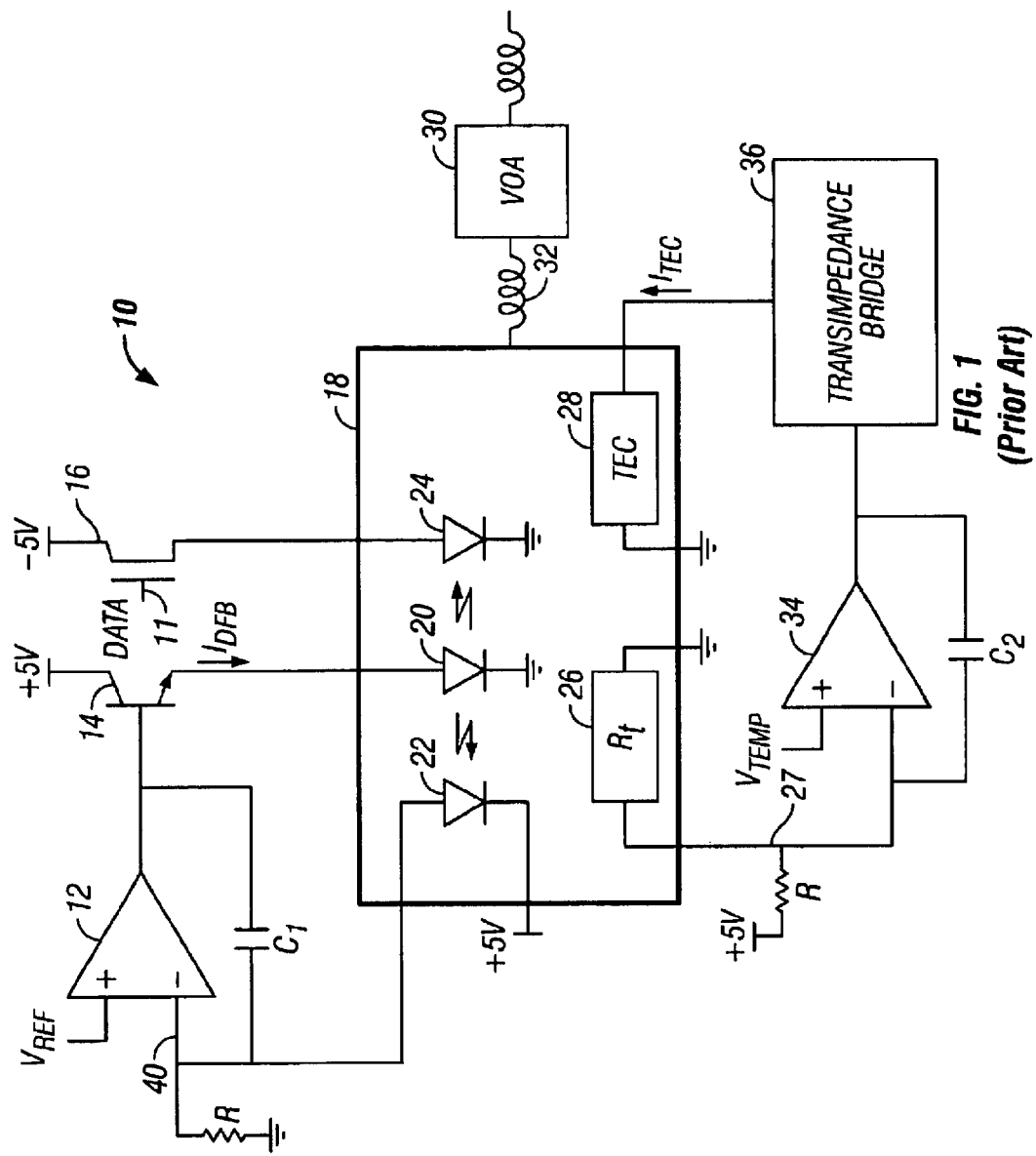
FIG. 1 is a circuit diagram of a laser transmitter of the prior art.

A typical laser transmitter 10 of the prior art is shown in FIG. 1. The laser transmitter includes a laser module 18 coupled to a variable optical attenuator (VOA) 30 via an optical fiber 32. The laser module includes a laser diode 20, a backface diode 22 and a modulator 24. The laser diode 20 typically provides a continuous wave output at a constant bias level corresponding to a constant power level. A data stream input 11 is coupled through gate 16 to modulator 24 to modulate the continuous wave output of the laser diode 20. For simplicity the modulator 24 is shown as a diode, though it is understood that it is commonly a Mach-Zhender interferometer or lithium niobate waveguide device. The modulated optical signal is coupled to the optical fiber 32.

The constant power output of the laser diode 20 is controlled using a bias current source and a power monitor loop. The bias current source, which includes operational amplifier 12 and transistor 14, provides an adjustable bias current $I_{DFB}$ to the laser diode. The power monitor loop includes backface diode 22 for monitoring the laser diode power output to provide a power monitor signal that is coupled to the negative input of op amp 12. The output of op amp 12 is coupled to the negative input through capacitor C1. The positive input of op amp 12 has a power reference voltage $V_{REF}$. The op amp 12 adjusts the bias current $I_{DFB}$ responsive to a difference between the power reference $V_{REF}$ and the power monitor signal. For example, if the power monitor signal is less than the power reference $V_{REF}$, op amp 12 provides more bias current.

To control the operating temperature of the laser transmitter, the laser module 18 includes a thermistor 26 and a thermal electric cooler (TEC) element 28. Operational amplifier 34 and transimpedance bridge 36 provide a control current $I_{TEC}$ to the TEC element 28. A temperature monitor loop includes thermistor 26 for monitoring the temperature operation point to provide a temperature monitor signal that is coupled to the negative input of op amp 34. The output of op amp 34 is coupled to the negative input through capacitor C2. The positive input of op amp 34 has a temperature reference voltage $V_{TEMP}$. The op amp 34 adjusts the control current $I_{TEC}$ to the TEC element 28 responsive to a difference between the temperature reference $V_{TEMP}$ and the temperature monitor signal. For example, if the temperature monitor signal is less than $V_{TEMP}$, the op amp 34 provides more current to the TEC element.

Direct electrical control of the power output of a laser diode generally is understood to be problematic, given the relationship between operating temperature and wavelength in such devices. In particular, the relationship depends on output power and the characteristics of individual devices.

Figure 2:
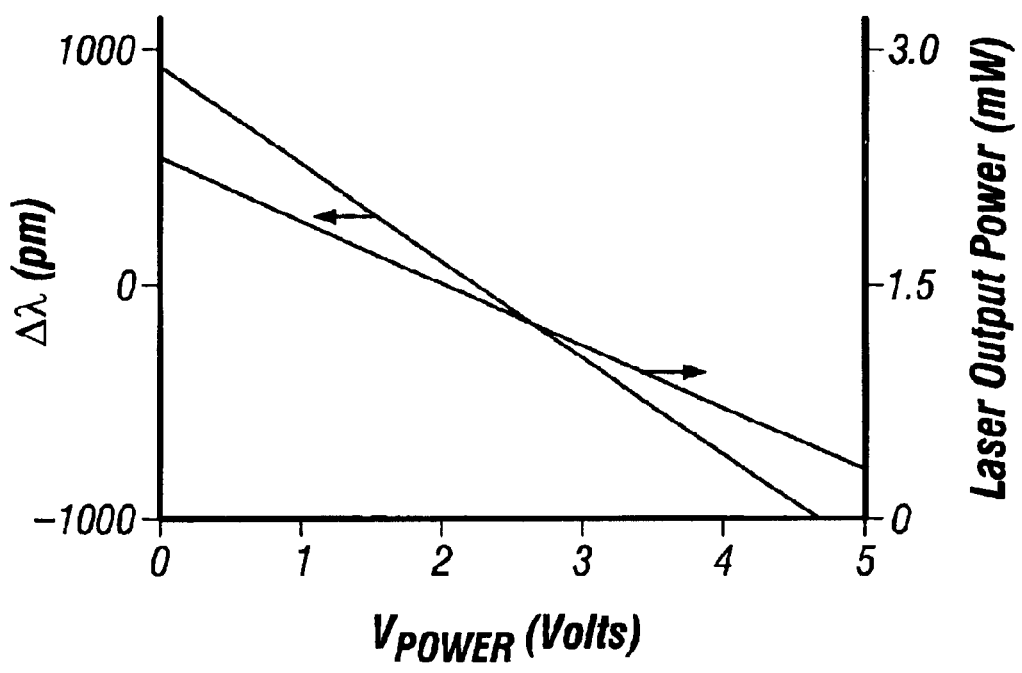
FIG. 2 is a chart that illustrates power control characteristics of the transmitter of FIG. 1.

Referring to FIG. 2, the chart illustrates the effect on operating wavelength when the laser output power is adjusted for the exemplary laser transmitter 10 of FIG. 1. In particular, by applying a voltage $V_{POWER}$ through a resistor to negative input 40 of op amp 12, the laser output power is adjusted. Note that the temperature control portion of the laser transmitter is kept constant, i.e., $V_{TEMP}$ is constant. The slope of the power adjustment curve (right vertical axis) is negative. That is, an increase in voltage $V_{POWER}$ results in a decrease in laser output power. A corresponding change $\Delta\lambda$ in operating wavelength occurs (left vertical axis) such that a decrease in laser power output results in a shorter operating wavelength.

As shown, a power change from 3.0 mW to below 1.0 mW results in a wavelength shift of about 2000 picometers. In modern dense wavelength division multiplex (DWDM) systems designed for 100 GHz or tighter channel spacings, the channels are only +/−100 picometers wide around a nominal specified center wavelength. Thus, the change in wavelength operation that occurs with the power adjustment shown in FIG. 2 is too large and is unacceptable for modern telecommunication systems.

Figure 3:
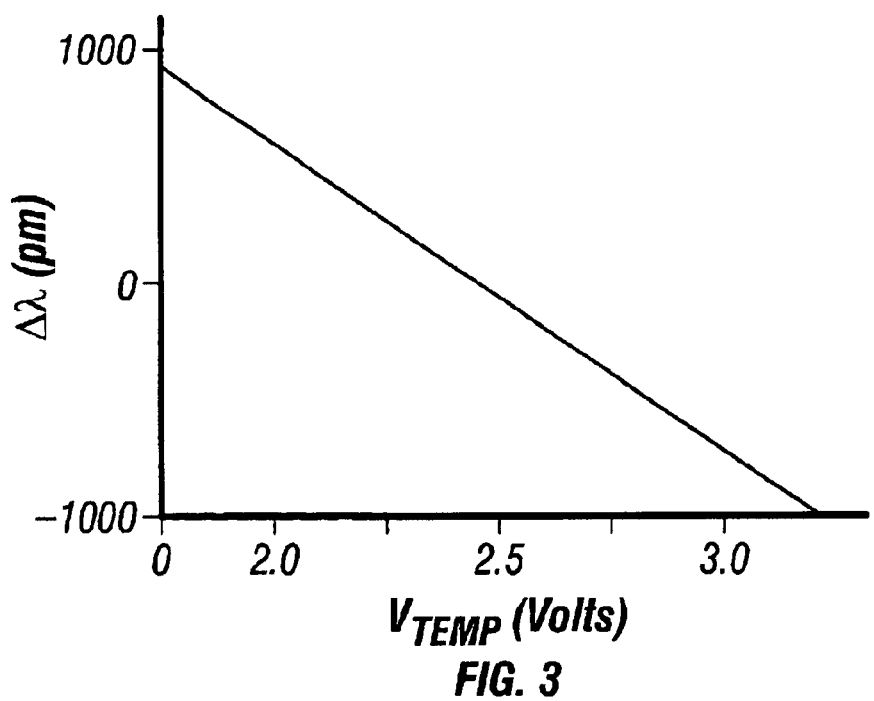
FIG. 3 is a chart that illustrates temperature control characteristics of the transmitter of FIG. 1.

FIG. 3 is a chart that illustrates the effect on operating wavelength when the temperature reference voltage $V_{TEMP}$ is adjusted for the laser transmitter 10 of FIG. 1 while the output power of the laser transmitter and $V_{REF}$ are kept constant. The slope of the curve in FIG. 3 is negative. That is, an increase in temperature reference voltage $V_{TEMP}$ causes the TEC element to operate at a cooler temperature which results in a shorter operating wavelength for the laser diode. As shown, a change in $V_{TEMP}$ from 2 to 3 volts results in a wavelength shift of about 2000 picometers.

It has been found in the present approach that, by taking into account the wavelength shift due to power adjustment and due to temperature, a power control circuit can be implemented that provides variable laser power output while maintaining operation of the laser diode at a nominal wavelength within an acceptable range.

Figure 4:
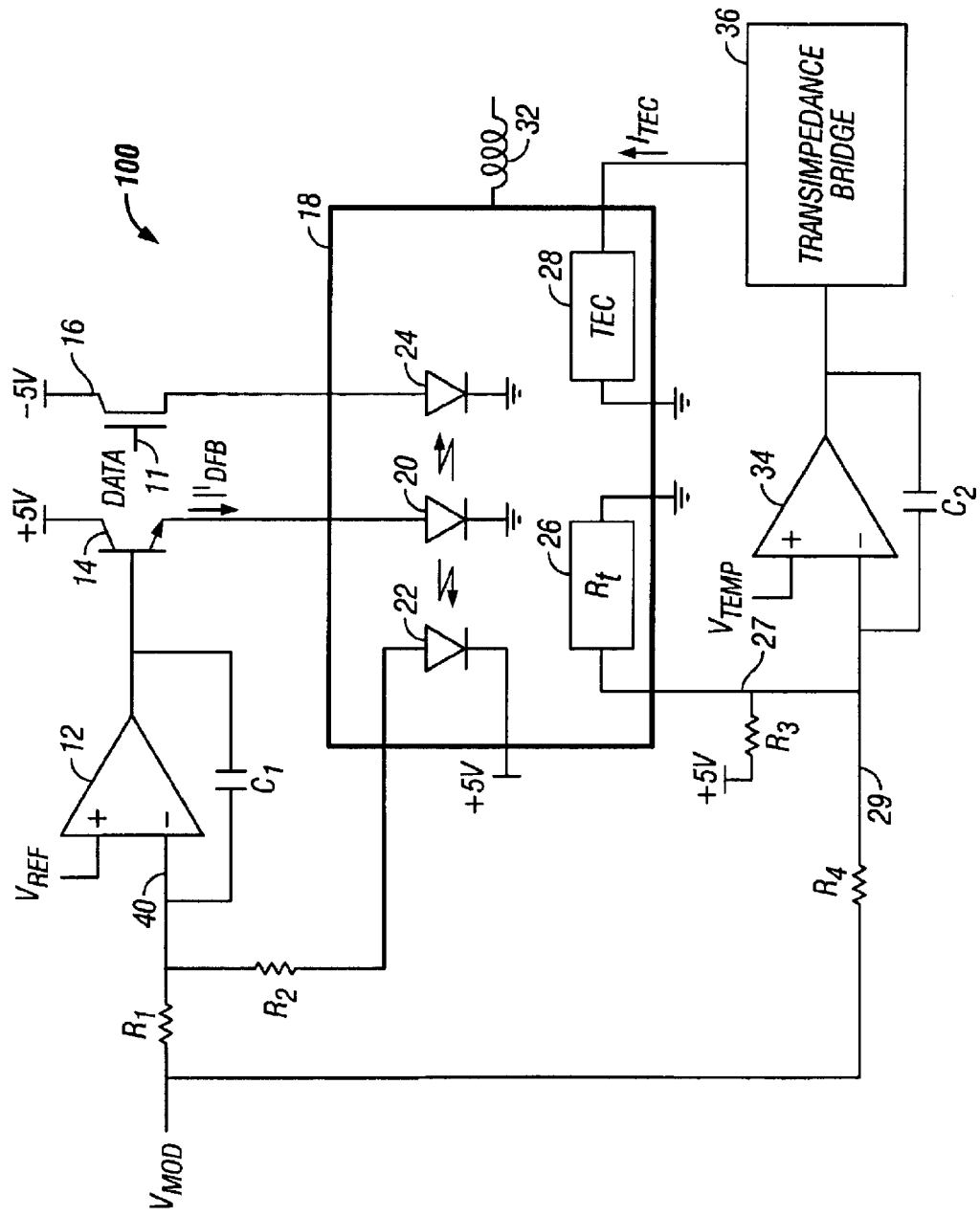
FIG. 4 is a circuit diagram of a first embodiment of a laser transmitter in accordance with the present system.

In an embodiment of a laser control circuit 100 in accordance with the present approach shown in FIG. 4, a power control signal $V_{MOD}$ is provided that is added to the power monitor signal through resistor network R1 and R2 at the negative input of op amp 12 so that the operational power level can be increased or decreased over the nominal set point provided by reference voltage $V_{REF}$. In addition, to compensate for the wavelength shift of the laser diode 22, a scaled version 29 of the power control signal $V_{MOD}$ is provided that is added to the temperature monitor signal 27 through resistor R4 at the negative input of op amp 34. Note that the control circuit 100 eliminates the need for a VOA (FIG. 1). Thus, a simple but elegant solution is provided to solve the problems noted above.

Different laser diode devices can exhibit different temperature and wavelength characteristics. Thus, in the control circuit 100 of FIG. 4, the values for resistors R1, R2, R3 and R4 can be accordingly adjusted to fit the characteristics of each laser diode.

Figure 5:
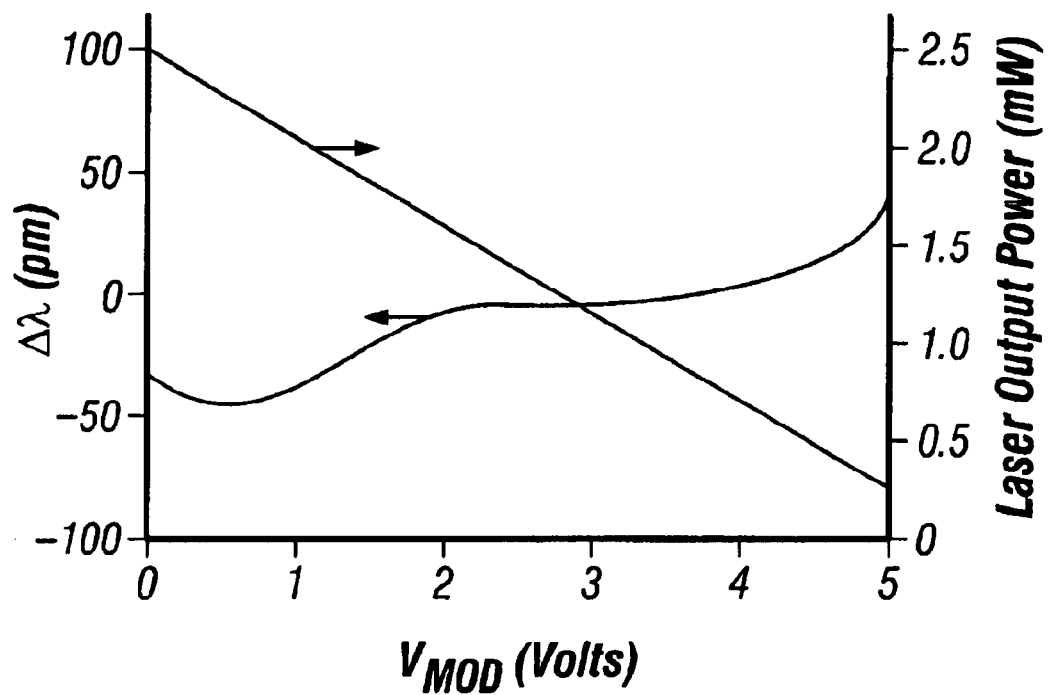
FIG. 5 is a chart illustrating power and wavelength control characteristics of the transmitter of FIG. 4.

As described, the control circuit 100 provides an adjustable output power. FIG. 5 shows the laser output power (right vertical axis) as it varies with the applied adjustment voltage, $V_{MOD}$. Note that for $V_{MOD}$ of 0V the output power is approximately 2.5 mW. With $V_{MOD}$ of 3V the output power is approximately 1.5 mW. Thus, linear adjustment of output power is provided.

FIG. 5 also shows a residual amount of wavelength variation (left vertical axis) for the control circuit of FIG. 4. Note that for $V_{MOD}$ of 0 V the difference between the intended wavelength and the actual wavelength, given as $\Delta\lambda$, is about 25 picometers. The negative sign indicates that the wavelength is less then the intended wavelength. For $V_{MOD}$ of 4.5 V the difference $\Delta\lambda$ is about 0.

As noted above, DWDM system today require tight channel spacings. Without the wavelength control feature provided as shown in FIG. 4, the variation of the laser wavelength as the power is adjusted from 2.5 mW to 0 mW (FIG. 5) will be very much larger than the acceptable variation. With the control circuit of FIG. 4, the residual wavelength variation is well within the acceptable variation.

Figure 6:
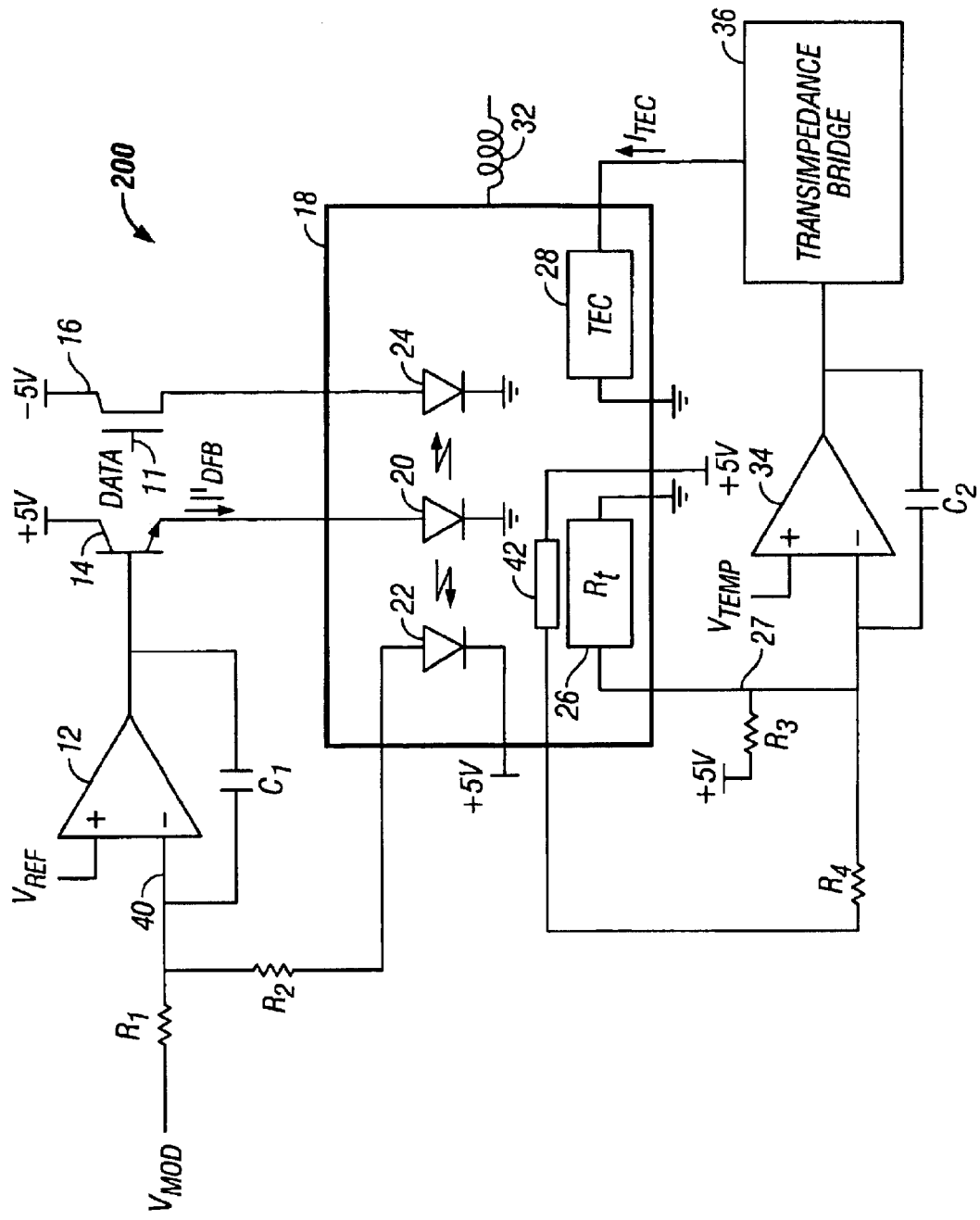
FIG. 6 is a circuit diagram of a second embodiment of a laser transmitter in accordance with the present system.

Referring to FIG. 6, a second embodiment of a control circuit 200 is shown. In this embodiment, a Fabry-Perot etalon locker device 42 is used to provide the wavelength compensation. The etalon locker 42 receives light emitted from laser diode 20, and based upon the wavelength of the light received, outputs a signal to add to the negative input of op amp 34 for controlling the wavelength.

While this invention has been particularly shown and described with references to preferred embodiments thereof, it will be understood by those skilled in the art that various changes in form and details may be made therein without departing from the scope of the invention encompassed by the appended claims.

What is claimed is:

1. A control circuit for a laser diode, the circuit comprising:
    a power control circuit for controlling an adjustable bias current to the laser diode that includes:
        a bias current source that provides an adjustable bias current to the laser diode and having a power reference voltage input;
        a power monitor loop including a backface diode for monitoring the laser diode power output to provide a power monitor signal;
        a power control signal combined with the power monitor signal to provide a power adjust signal, wherein the bias current source adjusts the bias current responsive to a difference between the power reference voltage input and the power adjust signal; and
    a temperature control circuit that provides a control current to a thermoelectric element for controlling temperature operation and wavelength of the laser diode that includes:
        a temperature reference voltage input;
        a temperature monitor loop including a temperature sensor for monitoring the temperature operation point to provide a temperature monitor signal;
        a wavelength compensation signal combined with the temperature monitor signal to provide a wavelength control signal, wherein the wavelength compensation signal is proportional to the power control signal;
        wherein the temperature control circuit adjusts the control current to the thermoelectric element responsive to a difference between the temperature reference voltage input and the wavelength control signal to help maintain operation of the laser diode around a nominal operating wavelength.

2. The power control circuit of claim 1, wherein the bias current source that provides an adjustable bias current to the laser diode and having a power reference voltage input comprises:
- an operational amplifier with the power reference voltage as a first input and the power adjust signal as a second input; and
- a transistor, wherein an output of the operational amplifier is connected to a gate of the transistor, a reference voltage is connected to an input of the transistor and wherein the output of the transistor is connected to the laser diode and provides the adjustable bias current to the laser diode.

3. An optical transmitter, comprising:
- a laser diode with an output signal;
- a power control circuit for controlling an adjustable bias current to the laser diode that comprises:
  - a bias current source that provides an adjustable bias current to the laser diode and comprising a power reference voltage input;
  - a power monitor loop comprising a backface diode for monitoring the laser diode power output and outputting a power monitor signal;
  - a power control signal added to the power monitor signal to provide a power adjust signal, wherein the bias current source adjusts the bias current responsive to a difference between the power reference voltage input and the power adjust signal; and
- a temperature control circuit that provides a temperature control signal to a thermoelectric element for controlling temperature operation of the laser diode that comprises:
  - a temperature reference voltage input;
  - a temperature monitor loop including a temperature sensor for monitoring temperature operation and providing a temperature monitor signal;
  - a wavelength compensation signal added to the temperature monitor signal to provide a wavelength control signal, wherein the wavelength compensation signal is proportional to the power control signal;
  - wherein the temperature control circuit adjusts the temperature control signal to the thermoelectric element responsive to a difference between the temperature reference voltage input and the wavelength control signal.

4. The optical transmitter of claim 3, further comprising:
- an external modulator for modulating the output signal of the laser diode.

5. The power control circuit of claim 3, wherein the bias current source that provides an adjustable bias current to the laser diode and having a power reference voltage input comprises:
- an operational amplifier with the power reference voltage as a first input and the power adjust signal as a second input; and
- a transistor, wherein an output of the operational amplifier is connected to a gate of the transistor, a reference voltage is connected to an input of the transistor and wherein the output of the transistor is connected to the laser diode and provides the adjustable bias current to the laser diode.

6. An optical transmitter, comprising:
- a laser diode with an output signal;
- a power control circuit for controlling an adjustable bias current to the laser diode in response to the laser diode power output and a power reference voltage input; and
- a temperature control circuit that provides a temperature control signal to a thermoelectric element for controlling temperature operation and wavelength compensation of the laser diode that comprises:
  - a temperature reference voltage input;
  - a temperature monitor loop including a temperature sensor for monitoring temperature operation and providing a temperature monitor signal;
  - a wavelength compensation signal added to the temperature monitor signal to provide a wavelength control signal, wherein the wavelength compensation signal is based on a wavelength of the output light signal of the laser diode and is generated by an etalon locker device that receives the output light signal emitted from the laser diode and outputs the wavelength compensation signal based upon the wavelength of the output light signal;
  - an operational amplifier for controlling the wavelength of the output light signal of the laser diode with a first input connected to the temperature reference voltage input and a second input connected to the wavelength control signal and an output for generating the temperature control signal, such that the temperature control circuit adjusts the temperature control signal to the thermoelectric element responsive to a difference between the temperature reference voltage input and the wavelength control signal.

7. The optical transmitter of claim 6, wherein the etalon locker device is a Fabry-Perot etalon locker device.

8. The optical transmitter of claim 6, wherein the power control circuit for controlling an adjustable bias current to the laser diode in response to the laser diode power output and a power reference voltage input comprises:
- a bias current source that provides an adjustable bias current to the laser diode and comprising the power reference voltage input; and
- a power monitor loop comprising a backface diode for monitoring the laser diode power output and outputting a power monitor signal.

9. The optical transmitter of claim 8, wherein the bias current source that provides an adjustable bias current to the laser diode and comprising the power reference voltage input comprises:
- an operational amplifier with the power reference voltage input as a first input and the power monitor signal as a second input; and
- a transistor wherein an output of the operational amplifier is connected to a gate of the transistor, a reference voltage is connected to an input of the transistor and wherein the output of the transistor is connected to the laser diode and provides the adjustable bias current to the laser diode.

* * * * *